United States Patent
Ghameshlu et al.

(10) Patent No.: US 6,639,442 B1
(45) Date of Patent: Oct. 28, 2003

(54) INTEGRATED CIRCUIT COMPRISING AT LEAST TWO CLOCK SYSTEMS

(75) Inventors: Majid Ghameshlu, Vienna (AT); Karlheinz Krause, Planegg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/088,740
(22) PCT Filed: Sep. 19, 2000
(86) PCT No.: PCT/DE00/03258
§ 371 (c)(1), (2), (4) Date: Mar. 22, 2002
(87) PCT Pub. No.: WO01/22588
PCT Pub. Date: Mar. 29, 2001

(30) Foreign Application Priority Data

Sep. 22, 1999 (DE) .......................... 199 45 421

(51) Int. Cl.⁷ .............................. G06F 1/04; H03K 3/00
(52) U.S. Cl. ...................... 327/293; 327/295; 327/296
(58) Field of Search ................................. 327/293, 295, 327/156, 147, 298, 141, 144, 296

(56) References Cited

U.S. PATENT DOCUMENTS

| 4,847,516 A | * | 7/1989 | Fujita et al. ................. 327/147 |
|---|---|---|---|
| 5,329,188 A | | 7/1994 | Sikkink et al. ................ 327/18 |
| 5,517,147 A | * | 5/1996 | Burroughs et al. .......... 327/295 |
| 5,578,945 A | | 11/1996 | Flora ............................ 326/93 |
| 5,604,775 A | | 2/1997 | Saitoh et al. ................. 375/376 |
| 5,870,445 A | * | 2/1999 | Farwell ....................... 375/371 |
| 5,944,834 A | | 8/1999 | Hathaway .................... 713/500 |
| 6,100,734 A | * | 8/2000 | Flora ........................... 327/156 |

FOREIGN PATENT DOCUMENTS

| EP | 0 962 851 | 12/1999 |
|---|---|---|

OTHER PUBLICATIONS

David C. Keezer "Clock Distribution Strategies for WSI: A Critical Survey" 1991 International Conference on Wafer Scale Integration, pp. 277–283, 1991.

* cited by examiner

Primary Examiner—Tuan T. Lam
(74) Attorney, Agent, or Firm—Morrison & Foerster LLP

(57) ABSTRACT

An integrated circuit having at least two clock systems in which the appropriate clock signal, starting from a clock input, can be forwarded through clock trees to individual switching elements or switching blocks. In this arrangement, each clock tree has an associated controlled switch which, for selected operating states, can be used to apply a single common clock signal to the clock trees, where at least a first clock tree has a PLL unit connected upstream of it, and an output of this clock tree is connected to an input of the PLL unit in order to form a phase locked loop, and the switches are actuated in selected operating states such that the common clock signal is supplied to a last clock tree, and an output of this clock tree is connected to the other input of the PLL unit for the at least first clock tree.

3 Claims, 2 Drawing Sheets

INTEGRATED CIRCUIT COMPRISING AT LEAST TWO CLOCK SYSTEMS

The invention relates to an integrated circuit having at least two clock systems in which the appropriate clock signal, starting from a clock input, can be forwarded through clock trees to individual switching elements or switching blocks, and having at least one controlled switch which, for selected operating states, can be used to apply a single common clock signal to all clock trees, where at least a first clock tree has a PLL unit connected upstream of it, and an output of this clock tree is connected to an input of the PLL unit in order to form a phase locked loop.

Integrated circuits for digital applications contain "clock trees". These are a tree-like structure for forwarding an input clock signal to the individual switching elements, normally flipflops, in the circuit.

The form of the clock trees depends on the number of flipflops in the subsystem, e.g. an.ASIC, and on the topology used. Depending on the number of stages it has and on its design, a clock tree in an ASIC can have, by way of example, 2000, 20 000, 40 000, etc. flipflops.

Figure 1:
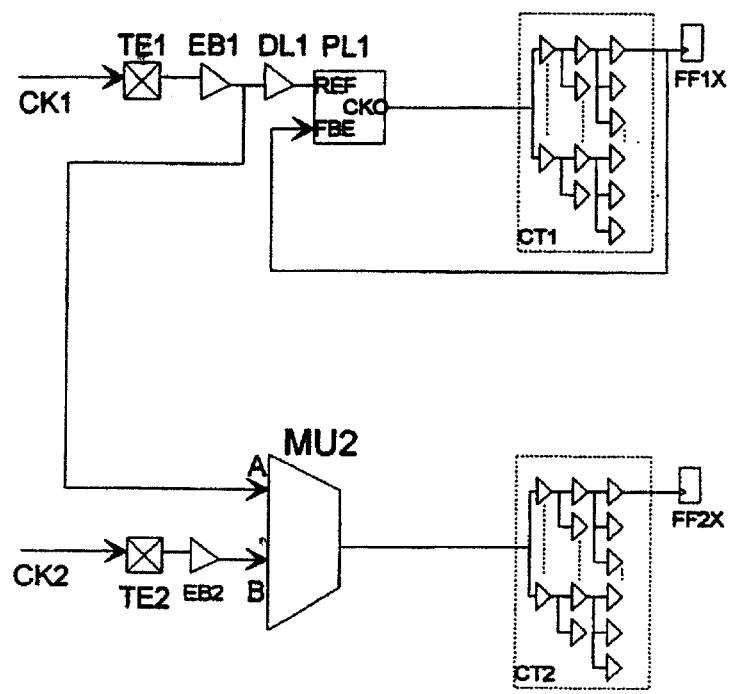

FIG. 1 shows the structure of an ASIC based on the prior art having two clock inputs TE1, TE2 for two clock trees CT1, CT2. The first clock signal CK1 is supplied from the clock input TE1 to the first clock tree CT1 via an input buffer EB1, a delay element DL1 and a PLL unit PL1. The clock signal is supplied to the appropriate register stages or flipflops possibly via further buffers in individual stages. For the clock tree CT1, a flipflop FF1x is shown at the end thereof by way of representation, and for the clock tree CT2 a flipflop FF2x is shown. A second clock signal CK2 is supplied from the clock input TE2 to the second clock tree CT2 via an input buffer EB2 and a controlled switch MU2, with the first clock signal CK1 also being routed to another input of the switch MU2.

For particular applications, in particular the "Built In Self Test" (=BIST), more than one clock system in an ASIC involves the clock systems being converted to a single clock system. However, this gives rise to the problem that the delay times from a clock input for the ASIC to the flipflop clock inputs for the subsidiary clock systems are different, since the clock trees have differences per se. The prior art solves this problem by using delay elements, reference being made in this case to the element DL1 in FIG. 1. Such delay elements adjust the path for the fastest clock tree—in FIG. 1 the clock tree CT1—to the slowest path. A drawback of this solution is that the internal delay elements are firstly subject to a tolerance and to process variation and secondly need to be able to be turned off for a bypass when the short delay time of the clock tree in question is required in normal operation of the circuit.

It is an object of the invention to provide an integrated circuit in which, for particular operating states, a common clock signal can be applied to all clock trees such that the aforementioned problems with delay times etc. do not arise.

This object is achieved with an integrated circuit of the type mentioned in the introduction, in which, on the basis of the invention, each clock tree has an associated controlled switch, and the switches are actuated in the selected operating states such that the common clock signal is supplied only to a last clock tree, and an output of this clock tree is connected to the other input of the PLL unit for the at least first clock tree.

Since, for normal operation of an ASIC, a PLL unit is in many cases provided for delay time compensation for a clock tree, this unit is often present anyway, and one or more controlled switches (multiplexers) is/are required only for the first clock tree or for further clock trees. This provides an easy way of dynamically adjusting the delay time, and the process variation can be eliminated.

In one advantageous variant of the invention, a delay module whose delay corresponds to that of a controlled switch is connected between the output of the at least first clock tree and one input of the PLL unit. This allows the delay which has occurred in the controlled switches to be compensated for, if required, for the phase locked loop. The corresponding implementation is of particularly simple form if the delay module is an unactuated switch corresponding to the switchable switches.

Figure 2:
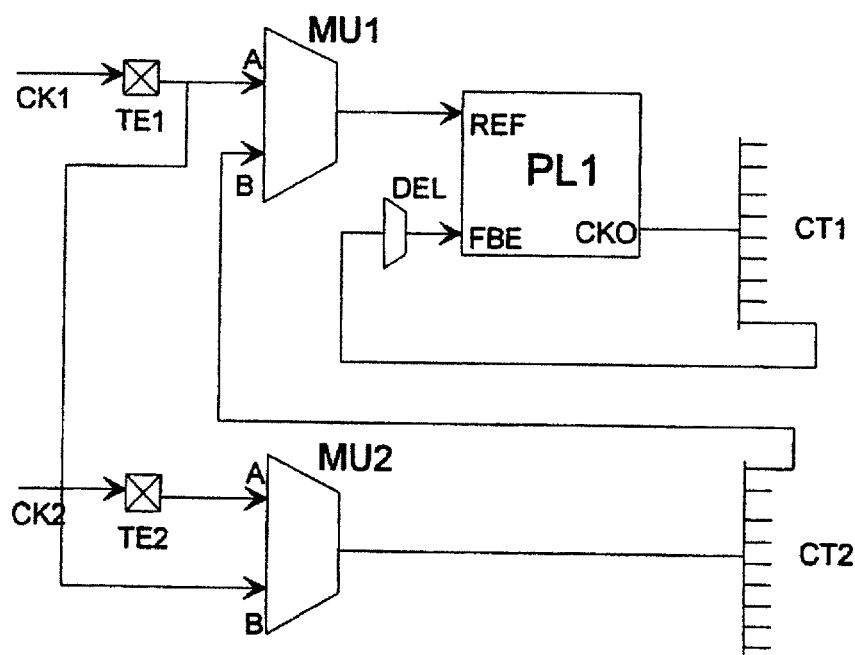
Figure 3:
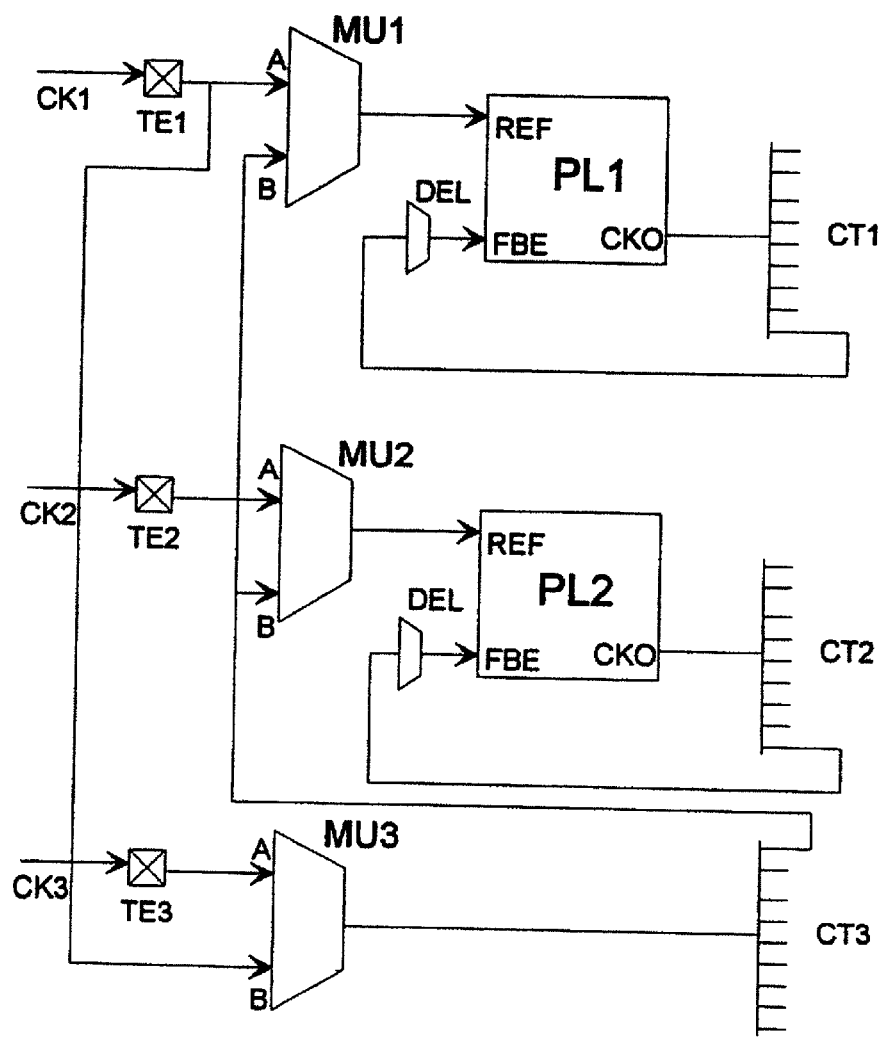

The invention together with other advantages is explained in more detail below with reference to the drawings, in which FIG. 1 shows an integrated circuit based on the prior art, FIG. 2 shows an integrated circuit based on the invention in a first embodiment having two clock trees, and FIG. 3 shows another embodiment of the invention having three clock trees.

FIG. 2 is to be understood as part of a block diagram for an ASIC as shown somewhat more accurately, but nevertheless schematically, in FIG. 1 relating to the prior art; in this case, however, it is complemented by the inventive features.

The ASIC has two clock trees CT1, CT2 and two clock inputs TE1, TE2 which, in normal operation, are used to supply a first clock signal CK1 and a second clock signal CK2 via first and second controlled switches MU1 and MU2 to first and second clock trees CT1 and CT2. In this normal mode, the first input "A" of each switch is connected through. In addition, a line is connected from the clock input TE1 to the second input "B" of the second controlled switch MU2.

The output of the first switch MU1 is routed to the first clock tree CT1 not directly but rather via a PLL unit PL1. In this case, the clock signal is supplied to the reference input REF of the unit PL1, whereas the second input FBE of said unit PL1 is connected to an output of the clock tree TE1 via a delay element DEL. The task of the delay element DEL (which is not absolutely necessary) is to compensate for a clock delay occurring in the controlled switch MU1. The delay time of the element DEL is therefore intended to correspond to that of the switch MU1, which is the very reason why the delay element DEL used in practice is an "idle" switch of the same type as the switch MU1.

As can also be seen from FIG. 2, an output of the last clock tree in the ASIC, in this case naturally of the second clock tree CT2, is routed to the second input "B" of the first controlled switch MU1, which has no effect at all in normal operation. However, if the two switches MU1, MU2 are changed over to their respective input "B", for example for a self test ("BIST"), only the first clock signal CK1 is now actively supplied to the ASIC as the common clock signal, specifically via the second switch MU2 and the second clock tree CT2 to the second input "B" of the first controlled switch MU1. From there, the clock signal is passed to the reference input REF of the PLL unit PL1. The clock signal routed via the entire second clock tree CT2 is thus now used as reference clock signal for the phase locked loop PL1-CT1-DEL.

The variant shown in FIG. 3 contains three clock trees TE1, TE2, TE3 which, in normal operation, receive one of three clock signals CK1, CK2, CK3 respectively from clock inputs TE1, TE2, TE3. As in the case of FIG. 2, the clock signals are supplied via controlled switches MU1, MU2, MU3 and —for the first two clock trees CT1, CT2—via PLL units PL1 and PL2. The output clock signal from the first two clock trees CT1, CT2 is in this case supplied to the feedback inputs FBE of the PLL units PL1, PL2 via a respective delay element DEL.

In continuation of the inventive concept explained in FIG. 2, in special operating states, such as in a "BIST" mode, only the first clock signal CK1 is now used, as a result of the three switches MU1, MU2, MU3 being changed over. In this case, the first clock signal CK1 is supplied via the third clock tree TE3 to the reference inputs REF of the PLL units PL1, PL2 as reference clock signal, which means that all three clock trees CT1, CT2, CT3 are now clocked with a common signal in the desired manner.

It is clear that the invention can be used in the same way for n clock systems, with (n−1) PLL units then being required. In all cases, dynamic adjustment of the delay time is ensured and the process variation is compensated for.

What is claimed is:

1. An integrated circuit, comprising:
   at least two clock systems in which a clock signal, starting from a clock input, is forwarded through clock trees to individual switching elements or switching blocks; and
   at least one controlled switch which, for selected operating states, applies a common clock signal to the at least two clock trees, wherein at least a first clock tree has a phase locked loop unit connected upstream, and an output of the first clock tree is connected to an input of the phase locked loop unit and forms a phase locked loop, wherein each clock tree has an associated controlled switch, the switches actuated in the selected operating states such that the common clock signal is supplied to a last clock tree, and an output of the last clock tree is connected to another input of the phase locked loop unit for the first clock tree.

2. An integrated circuit, comprising:
   at least two clock systems in which a clock signal, starting from a clock input, is forwarded through clock trees to individual switching elements or switching blocks;
   at least one controlled switch which, for selected operating states, applies a common clock signal to the at least two clock trees, wherein at least a first clock tree has a phase locked loop unit connected upstream, and an output of the first clock tree is connected to an input of the phase locked loop unit and forms a phase locked loop, wherein each clock tree has an associated controlled switch, the switches actuated in the selected operating states such that the common clock signal is supplied to a last clock tree, and an output of the last clock tree is connected to another input of the phase locked loop unit for the first clock tree; and
   a delay module, whose delay corresponds to the at least one controlled switch, is connected between the output of the at least first clock tree and one input of the phase locked loop unit.

3. The circuit as claimed in claim 2, wherein the delay module is a non-actuated switch corresponding to the at least one controlled switch.

* * * * *